(12) United States Patent
Feyh

(10) Patent No.: US 8,212,326 B2
(45) Date of Patent: Jul. 3, 2012

(54) MANUFACTURING METHOD FOR A MICROMECHANICAL COMPONENT HAVING A THIN-LAYER CAPPING

(75) Inventor: Ando Feyh, Tamm (DE)

(73) Assignee: Robert Bosch GmbH, Stuttgart (DE)

( * ) Notice: Subject to any disclaimer, the term of this patent is extended or adjusted under 35 U.S.C. 154(b) by 184 days.

(21) Appl. No.: 12/835,328

(22) Filed: Jul. 13, 2010

(65) Prior Publication Data

US 2011/0018078 A1    Jan. 27, 2011

(30) Foreign Application Priority Data

Jul. 21, 2009   (DE) .......................... 10 2009 027 898

(51) Int. Cl.
*H01L 29/84* (2006.01)

(52) U.S. Cl. ......... 257/417; 257/E29.324; 257/E21.002; 438/50

(58) Field of Classification Search .................. 257/417, 257/E29.324, E21.002; 438/50
See application file for complete search history.

(56) References Cited

U.S. PATENT DOCUMENTS 6,951,824 B2 * 10/2005 Fischer et al. ................ 438/717
2008/0042260 A1 * 2/2008 Jeong et al. ................... 257/704
2008/0136000 A1 * 6/2008 Fischer et al. ................ 257/682
2010/0127339 A1 * 5/2010 Laermer et al. ............... 257/415
2011/0006444 A1 * 1/2011 Schmitz et al. ............... 257/787

* cited by examiner

*Primary Examiner* — Trung Q Dang
(74) *Attorney, Agent, or Firm* — Kenyon & Kenyon LLP

(57) ABSTRACT

A manufacturing method for a micromechanical component having a thin-layer capping. The method includes the following: forming a functional layer on a substrate; structuring the functional layer in first cutout regions having a first width and in regions of the functional layer to be removed having a second width, the second width being substantially greater than the first width; forming a first oxide layer on the structured functional layer; forming a first sealing layer on the thermally oxidized and structured functional layer, the first cutout regions having the first width being sealed; forming a cap layer on the first sealing layer; forming first through holes which extend through the cap layer, the first sealing layer, and the first oxide layer for at least partially exposing the regions of the functional layer to be removed; and selectively removing the regions of the functional layer to be removed, by introducing a first etching medium through the first through holes, resulting in second cutout regions in the functional layer which have the second width.

14 Claims, 4 Drawing Sheets

MANUFACTURING METHOD FOR A MICROMECHANICAL COMPONENT HAVING A THIN-LAYER CAPPING

RELATED APPLICATION INFORMATION

The present application claims priority to and the benefit of German patent application no. 10 2009 027 898.2, which was filed in Germany on Jul. 21, 2009, the disclosure of which is incorporated herein by reference.

FIELD OF THE INVENTION

The present invention relates to a manufacturing method for a micromechanical component having a thin-layer capping. Although applicable to any given micromechanical components, the present invention and its underlying background are explained with regard to micromechanical components using silicon technology.

BACKGROUND INFORMATION

Capping of sensitive micromechanical components was originally carried out by bonding or gluing a cap wafer onto a completely processed sensor wafer.

In recent years a new capping method, thin-layer capping, has been developed which dispenses with a cap wafer, and instead a cavity or cavern is provided between the micromechanical structures to be exposed and a silicon layer, as the cap layer, which is produced using a customary deposition process.

A method is discussed in German patent document DE 10 2006 049 259 A1, as being for manufacturing a micromechanical component having a cap layer, a cap layer being deposited onto a filling layer, and micropores then being formed in the cap layer. The filling layer is then removed by gas phase etching, using $ClF_3$ which is passed through the micropores, the selectivity of the etching medium mixture and the composition of the filling layer being set in such a way that the selectivity with respect to the cap layer is high enough that the cap layer is not attacked. After the filling layer is removed, the micropores are sealed by depositing a sealing layer.

German patent document DE 10 2007 022 509 A1 discusses a manufacturing method for a micromechanical component having thin-layer capping, a gas which has a nonatmospheric composition on account of the decomposition of a polymer being trapped in the cavern.

SUMMARY OF THE INVENTION

The manufacturing method according to the present invention, defined herein, for a micromechanical component having a thin-layer capping has the advantage that functional structures or sensor structures having small and large interspace widths may be provided in an integrated process. The manufacturing method according to the present invention is therefore suited for yaw rate sensors and pressure sensors, as well as for future inertial sensors.

The concept upon which the exemplary embodiments and/or exemplary methods of the present invention are based is a combined sacrificial layer process, for example a silicon/silicon oxide sacrificial layer process, for providing large and small lateral gap widths, i.e., interspace widths. These are suited in particular for yaw rate sensors.

The method according to the present invention makes large gap widths possible without the need for additional layers such as SiGe, for example, as sacrificial layers. In addition, thick oxide layers, which usually have high stresses and which may be etched only very slowly, may be dispensed with. The process times are thus reduced for the manufacturing method according to the present invention.

The use of silicon as a sacrificial layer allows very short etching times, using $ClF_3$, for example. There is no need to deposit thick sacrificial layers, and existing layers, for example portions of the functional layer, may be used as the sacrificial layer.

It is advantageous that only one additional oxidation, for example thermal oxidation, of small layer thickness is required as a protective layer for the functional layer to be structured.

The features stated in the subclaims relate to advantageous refinements of and improvements on the applicable subject matter of the present invention.

Exemplary embodiments of the present invention are illustrated in the drawing and explained in greater detail in the following description.

DETAILED DESCRIPTION

Figure 1:
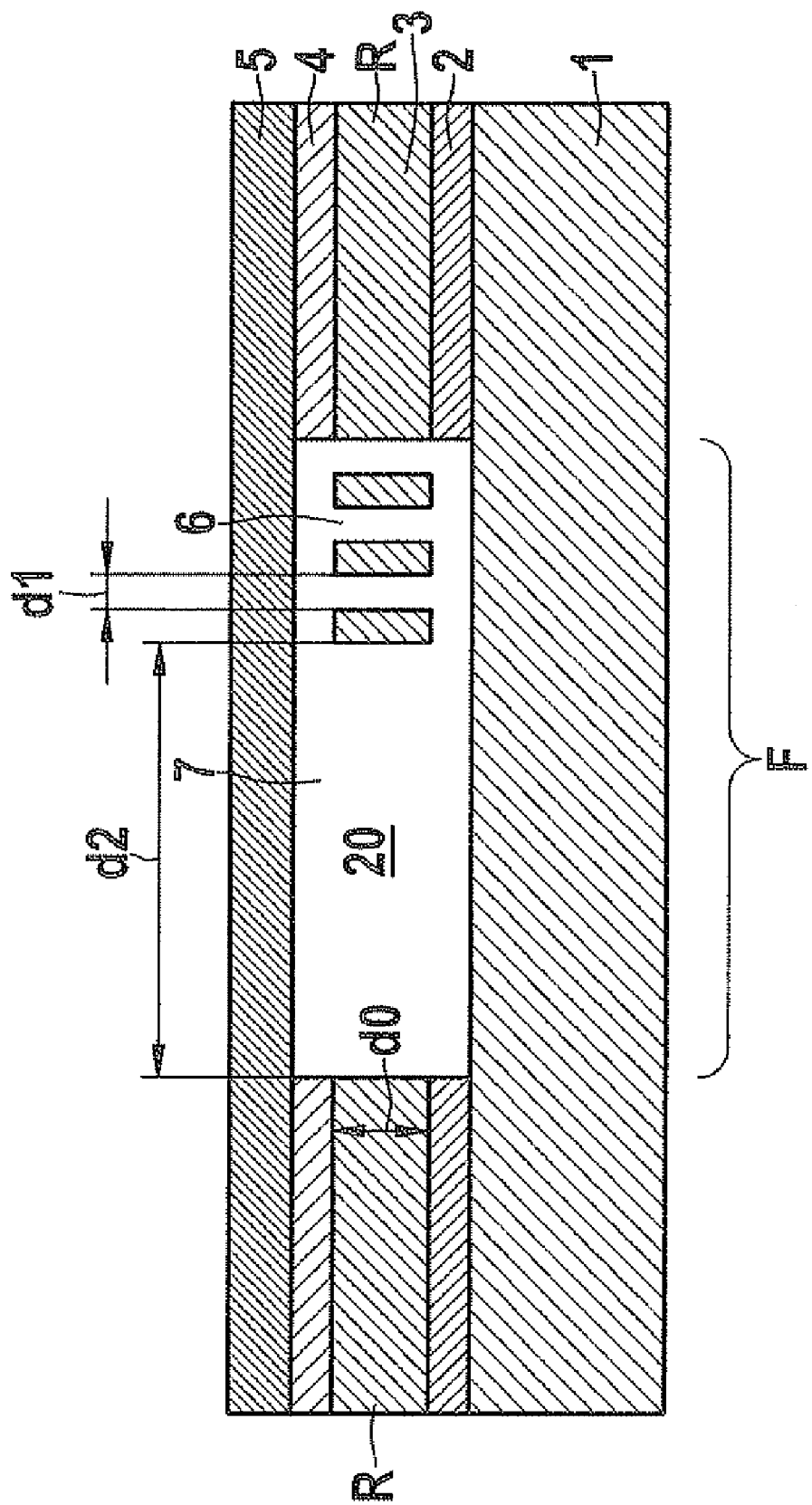
FIG. 1 shows a schematic cross-sectional illustration of a micromechanical component to which the manufacturing method according to the present invention may be applied, for explaining the underlying background of the present invention.

Identical or functionally corresponding elements are denoted by the same reference numerals in the figures.

FIG. 1 is a schematic cross-sectional illustration of a micromechanical component to which the manufacturing method according to the present invention may be applied, for explaining the underlying background of the exemplary embodiments and/or exemplary methods of the present invention.

In FIG. 1 reference numeral 1 denotes a silicon wafer substrate on which a first insulation layer 2 composed of silicon oxide is provided. A structured functional layer 3 composed of silicon and having edge regions R and a functional region F is provided on first insulation layer 2. For example, functional layer 3 has a thickness d0 of 100 nm to 40 μm. A second insulation layer 4 composed of silicon oxide, and thereabove a cap layer 5 composed of silicon, are provided above functional layer 3.

In functional region F, functional layer 3 has first cutout regions 6 having a first smaller width d1 of typically 1 μm, and second cutout regions 7 having a width d2 of typically 20 μm. Reference numeral 20 denotes a cavern in which regions 6, 7 are provided. Region 6 includes, for example, a capacitor structure having finger electrodes.

Edge region R is used to fixedly connect cap layer 5 to substrate 1, and thus to seal cavern 20. In this regard it should be noted that, although in the present case cavern 20 is represented as hermetically sealed, a nonhermetic type of seal having access points to cavern 20 is also possible.

FIGS. 2a-f are schematic cross-sectional illustrations for explaining one specific embodiment of the manufacturing method for a micromechanical component having a thin-layer capping according to the present invention.

The manufacturing method described below according to one specific embodiment of the present invention allows a combined and integrated manufacture of both cutout regions 6, 7 in a simple and relatively quick process.

Figure 2A:
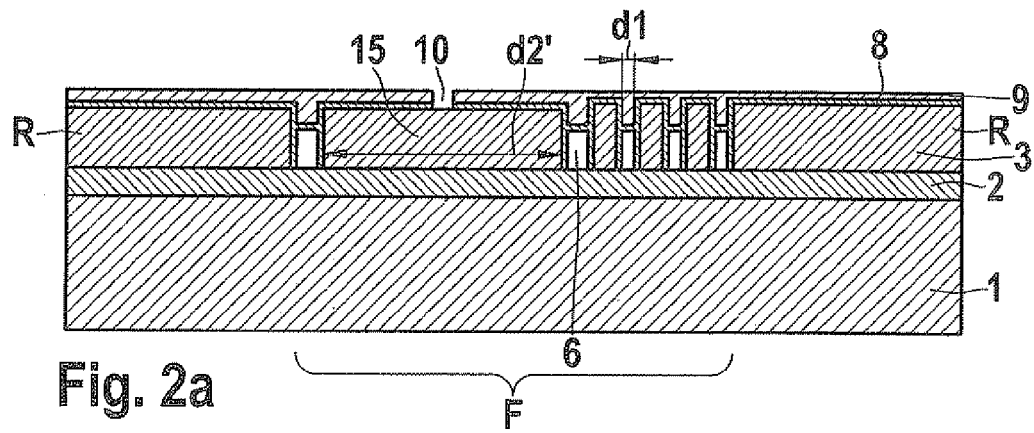
FIG. 2a shows a schematic cross-sectional illustration for explaining one specific embodiment of the manufacturing method for a micromechanical component having a thin-layer capping according to the present invention.

According to the illustration of FIG. 2a), first insulation layer 2 composed of silicon oxide is formed on silicon wafer substrate 1, and functional layer 3 composed of silicon formed on insulation layer 2.

Functional layer 3 is structured, using customary processes, in first cutout regions 6 having first width d1, and in regions 15 to be removed having a second width d2'. A thermal oxidation step is then carried out for forming a first thermal oxide layer 8 on functional layer 3 which is structured in this way.

The purpose of this first thermal oxide layer 8 on structured functional layer 3 is to protect the functional layer or the sensor structure (not shown) integrated therein during the subsequent silicon sacrificial layer etching process for functional layer 3 in region 15. Only a small layer thickness of a few nanometers of oxide layer 8 is necessary, since the thermal oxide may be produced in conformance with requirements and essentially free of pinholes.

In the present case, for the sake of simplicity the structure distance between region 15 of functional layer 3, to be removed, and regions of surrounding functional layer 3 is also assumed to have a width d1. Therefore, with reference to FIG. 1 the relationship $$d2 = d2' + 2d1$$

applies, as explained in greater detail below.

The thermal oxidation step for forming thermal oxide layer 8 is followed by deposition of a first sealing layer 9 composed of silicon oxide, first cutout regions 6 having first width d1 being sealed. In this regard it should be noted that at this point in time, only small gap widths, i.e., widths d1, are present overall in functional region F, which allows the customary thin-layer oxidation sealing process which seals the gaps on the top but does not completely fill them.

First sealing layer 9 and thermal oxide layer 8 are then opened in a region 10 above region 15 to be removed, in order to expose region 15 to be removed at the surface thereof in region 10. Likewise, first sealing layer 9 is structured in regions (not illustrated) for subsequent electrical contacting to the outside.

Figure 2B:
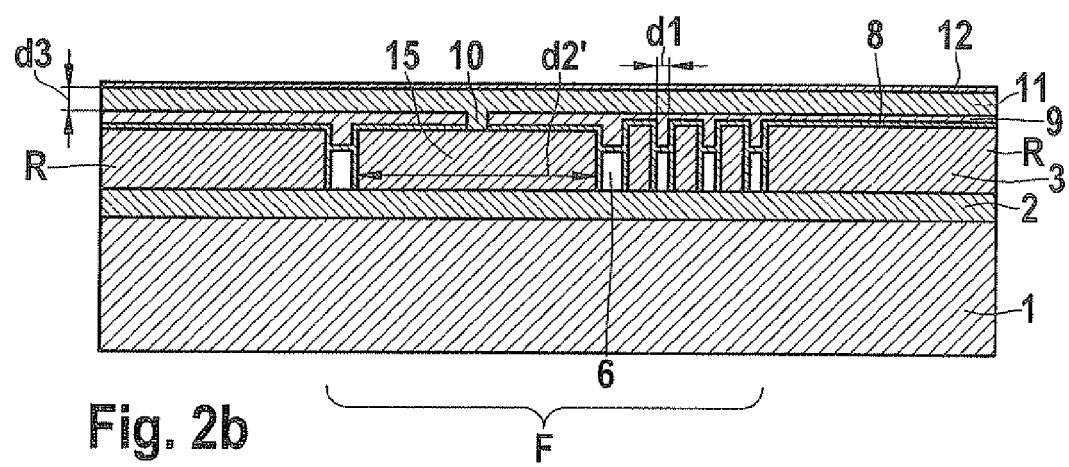
FIG. 2b shows another schematic cross-sectional illustration for explaining one specific embodiment of the manufacturing method for a micromechanical component having a thin-layer capping according to the present invention.

Furthermore, with reference to FIG. 2b) a first cap layer 11 composed of silicon is deposited, and a second thermal oxide layer 12 is formed thereon. Cap layer 11 composed of silicon has a thickness d3 of typically 0.1 μm to 5 μm, and in region 10 is connected to functional layer 3.

Figure 2C:
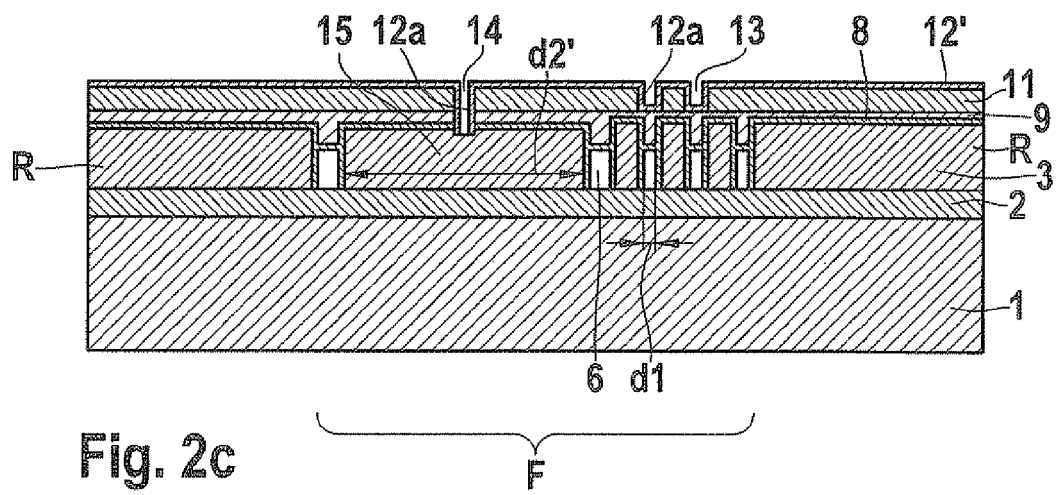
FIG. 2c shows another schematic cross-sectional illustration for explaining one specific embodiment of the manufacturing method for a micromechanical component having a thin-layer capping according to the present invention.

As illustrated in FIG. 2c), first and second through holes 14, 13 are then formed, using a customary structuring technique. First through holes 14 extend through cap layer 11, first sealing layer 9, and first thermal oxide layer 8, and expose region 15, to be removed, at the top thereof.

Second through holes 13 extend through cap layer 11, and expose first sealing layer 9 above cutout regions 6 having first width d1.

First and second through holes 14, 13 having different depths may be produced in a one-step process using known techniques, since in region 10 of through holes 14, first thermal oxide layer 8 and first sealing layer 9 have already been removed.

However, in one possible variant of the method, first thermal oxide layer 8 and first sealing layer 9 could be left intact in region 10, and a two-step etching process could be used with an intermediate masking of first through holes 13.

Following the formation of first and second through holes 14, 13, a third thermal oxidation is carried out for forming a third thermal oxide layer 12a on cap layer 11 in the interior region of first and second through holes 14, 13. The thickness of third thermal oxide layer 12a is smaller than the thickness of second thermal oxide layer 12. Following the formation of third thermal oxide layer 12a, this layer may be removed from the base region of first through holes 14 by anisotropic oxide etching. In order for third thermal oxide layer 12a to have a smaller thickness than second thermal oxide layer 12, a residual layer 12' of second thermal oxide layer 12 remains on the top of cap layer 11.

Figure 2D:
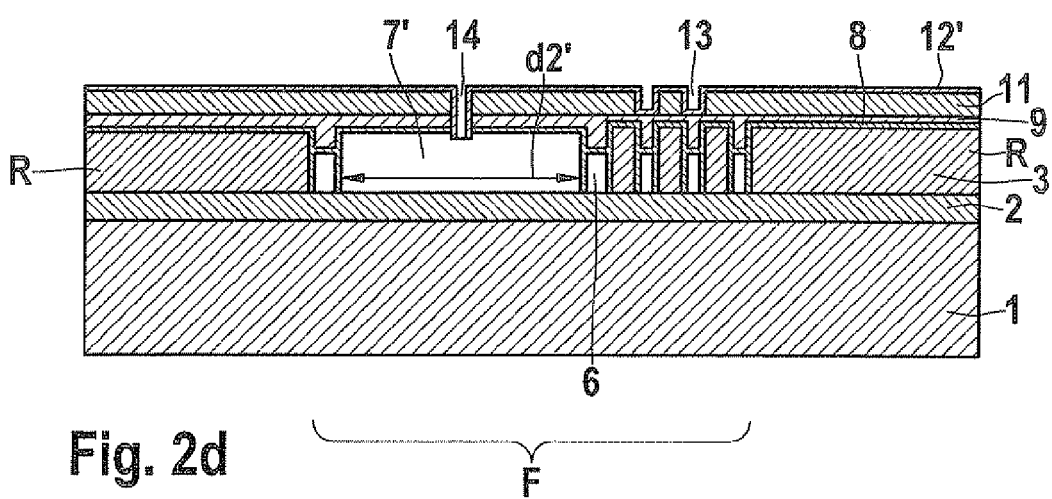
FIG. 2d shows another schematic cross-sectional illustration for explaining one specific embodiment of the manufacturing method for a micromechanical component having a thin-layer capping according to the present invention.

Furthermore, with reference to FIG. 2d), this is followed by silicon sacrificial layer etching in region 15, to be removed, through first through holes 14, for example using $ClF_3$ as the etching medium. This etching process is selective, and other regions are not attacked due to the fact that they are enclosed in thermal oxide or oxide. Thus, second cutout regions 7' having second width d2' are formed in functional layer 3.

Figure 2E:
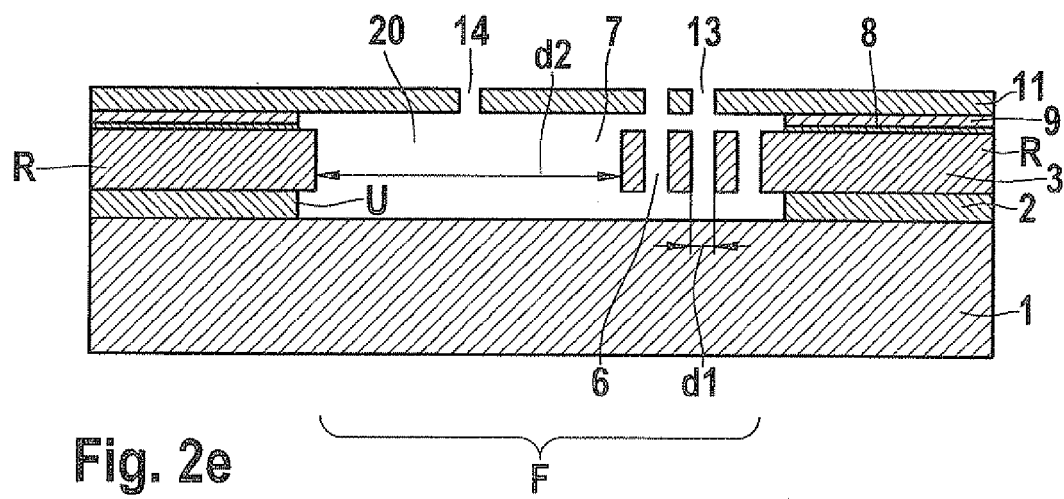
FIG. 2e shows another schematic cross-sectional illustration for explaining one specific embodiment of the manufacturing method for a micromechanical component having a thin-layer capping according to the present invention.

As illustrated in FIG. 2e), this is followed by oxide sacrificial layer etching, carried out by HF vapor etching, for example, in order to remove first sealing layer 9 and first through third thermal oxide layers 8, 12, 12a. The etching takes place through first and second through holes 14, 13. In edge regions R there is a certain controllable undercutting U below or above functional layer 3. Furthermore, with reference to FIG. 2e), thickness d2 according to FIG. 1 is expanded in second region 7 by oxide sacrificial layer etching of second region 7'.

Figure 2F:
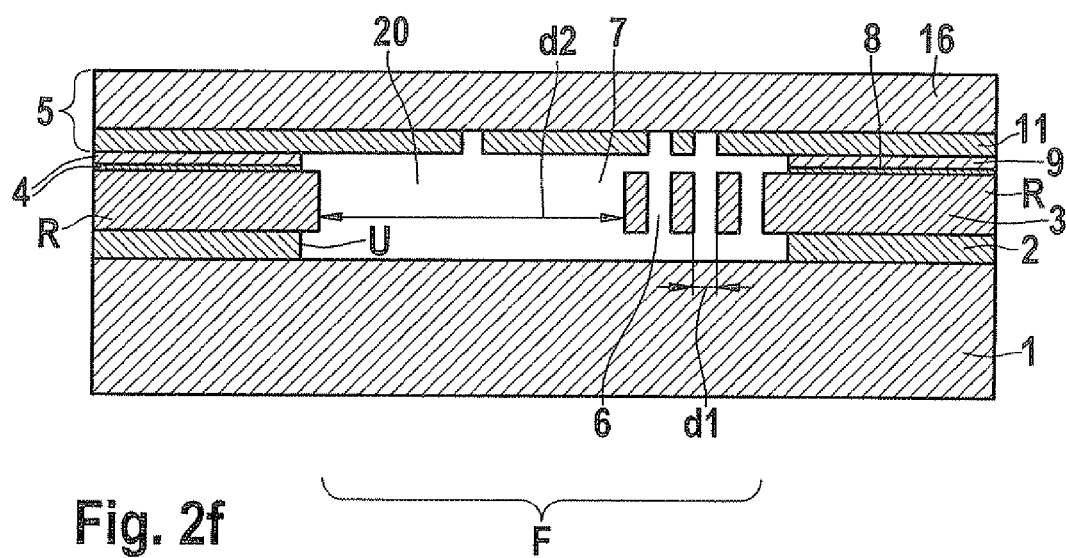
FIG. 2f shows another schematic cross-sectional illustration for explaining one specific embodiment of the manufacturing method for a micromechanical component having a thin-layer capping according to the present invention.

Lastly, with reference to FIG. 2f) a second sealing layer 16, specifically using silicon epitaxy, for example, is deposited over cap layer 11. This results in the process state according to FIG. 2f), which corresponds to the process state described in conjunction with FIG. 1. Capping layer 5 is formed by layers 11, 16, and upper insulation layer 4 is formed by layers 8, 9.

Likewise, first insulation layer 2 is removed in functional region F during the oxide sacrificial layer etching, so that the structures in first cutout region 6 having first width d1 become movable.

Further process steps, for example insulation trenching, upper metal plating, etc., are not addressed below since they are already known to those with average skills in the art.

Although the exemplary embodiments and/or exemplary methods of the present invention has been described above with reference to the exemplary embodiments, it is not limited thereto, and may be modified in various ways.

In particular, the materials are named only as examples, and may be replaced by other materials which meet the required selectivity criteria for etching.

Instead of first thermal oxide layer 8, a TEOS oxide or HTO oxide layer to be deposited in conformance with requirements may be used.

What is claimed is:

1. A manufacturing method for a micromechanical component, the method comprising:
    forming a functional layer on a substrate;
    structuring the functional layer in first cutout regions having a first width and in regions of the functional layer to be removed having a second width, the second width being substantially greater than the first width;
    forming a first oxide layer on the structured functional layer so as to provide a thermally oxidized and structured functional layer;
    forming a first sealing layer on the thermally oxidized and structured functional layer, the first cutout regions having the first width being sealed;
    forming a cap layer on the first sealing layer;
    forming first through holes which extend through the cap layer, the first sealing layer, and the first oxide layer for at least partially exposing the regions of the functional layer to be removed; and
    selectively removing the regions of the functional layer to be removed, by introducing a first etching medium through the first through holes, resulting in second cutout regions in the functional layer which have the second width.

2. The manufacturing method of claim 1, further comprising:
    forming second through holes in the cap layer for partially exposing the first sealing layer above the sealed first cutout regions; and
    partially and selectively removing the first sealing layer and the first oxide layer by introducing a second etching medium through the second through holes, thus opening the first cutout regions having the first intermediate width, and expanding the second cutout regions to a third width, and the first cap layer remaining above the functional layer.

3. The manufacturing method of claim 1, further comprising:
    forming an insulation layer between the substrate and the functional layer, a partial selective removal of the insulation layer taking place in the partial selective removal of the first sealing layer and of the first oxide layer.

4. The manufacturing method of claim 1, further comprising:
    forming a second sealing layer on the cap layer.

5. The manufacturing method of claim 2, further comprising:
    forming a second oxide layer on the cap layer before forming the first through hole and the second through hole.

6. The manufacturing method of claim 5, further comprising:
    forming a third oxide layer on the cap layer after forming the first through hole and the second through hole in the interior wall region of the first through hole and the second through hole; and
    removing the third oxide layer from the base region of the first through hole and the second through hole.

7. The manufacturing method of claim 6, wherein the oxide layer is removed from the base region of the first through hole and the second through hole in an anisotropic etching step.

8. The manufacturing method of claim 1, wherein the substrate, the functional layer, and the cap layer are silicon layers.

9. The manufacturing method of claim 1, wherein the first sealing layer is a silicon oxide layer.

10. The manufacturing method of claim 1, wherein the functional layer has a thickness of 100 nm to 40 µm.

11. The manufacturing method of claim 1, wherein before forming the cap layer on the first sealing layer, a particular region of the first thermal oxide layer and of the first sealing layer, through which the first through holes subsequently extend, is removed, and the cap layer is connected to the functional layer through this region before forming the first through holes.

12. The manufacturing method of claim 1, wherein the first oxide layer is one of a thermal oxide layer, a TEOS oxide layer, and an HTO oxide layer deposited in conformance with requirements.

13. A micromechanical component, comprising:
    a functional layer on a substrate, wherein the functional layer is structured in first cutout regions having a first width and in regions of the functional layer to be removed having a second width, the second width being substantially greater than the first width;
    a first oxide layer on the structured functional layer so as to provide a thermally oxidized and structured functional layer;
    a first sealing layer on the thermally oxidized and structured functional layer, the first cutout regions having the first width being sealed; and
    a cap layer on the first sealing layer;
    wherein first through holes which extend through the cap layer, the first sealing layer, and the first oxide layer for at least partially exposing the regions of the functional layer to be removed, and
    wherein the regions of the functional layer to be removed were selectively removed, by introducing a first etching medium through the first through holes, resulting in second cutout regions in the functional layer which have the second width.

14. The micromechanical component of claim 13, wherein the micromechanical component includes one of a yaw rate sensor, a pressure sensor, and an acceleration sensor.

* * * * *